(12) United States Patent
Tezuka et al.

(10) Patent No.: US 7,009,200 B2
(45) Date of Patent: Mar. 7, 2006

(54) FIELD EFFECT TRANSISTOR

(75) Inventors: Tsutomu Tezuka, Yokohama (JP); Shinichi Takagi, Tokyo (JP); Tomohisa Mizuno, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 42 days.

(21) Appl. No.: 10/609,650

(22) Filed: Jul. 1, 2003

(65) Prior Publication Data
US 2004/0155256 A1 Aug. 12, 2004

(30) Foreign Application Priority Data
Jul. 1, 2002 (JP) .............................. 2002-192681

(51) Int. Cl.
*H01L 29/06* (2006.01)

(52) U.S. Cl. .................... 257/19; 257/20; 257/27; 257/63

(58) Field of Classification Search ............ 257/27, 257/192, 63, 19, 20, 24, 213, 351, 369, 616, 257/741; 438/285, 590, 603, 604
See application file for complete search history.

(56) References Cited

U.S. PATENT DOCUMENTS

| 5,734,181 A | 3/1998 | Ohba et al. | |
|---|---|---|---|
| 6,190,975 B1 * | 2/2001 | Kubo et al. | 438/285 |
| 2003/0201497 A1 * | 10/2003 | Inoue et al. | 257/351 |

FOREIGN PATENT DOCUMENTS

JP 2002-076347 3/2002

OTHER PUBLICATIONS

T. Tezuka et al., "Fabrication of Strained Si On An Ultrathin SiGe-on-Insulator Virtual Substrate With A High-Ge Fraction", Applied Physics Letters, Sep. 17, 2001, vol. 79, pp. 1798-1800.
Qiqing Christine Ouyang et al., "Built-in Longitudinal Field Effects In Sub-100-nm Graded $Si_{1-x}Ge_x$ Channel PMOSFETs", IEEE Transactions On Electron Devices, Jun. 2001, vol. 48, No. 6, p. 1245-1250.
T. Tezuka et al., "Novel Fully-depleted SiGe-on-insulator pMOSFETs with High-mobility SiGe surface Channels", Tech. Dig. IEDM, Dec. 2001, p. 946-948.
T. Tezuka et al., "Semiconductor Device and Method of Manufacturing the same", U.S. Appl. No. 10/029,022, filed Dec. 28, 2001.
T. Tezuka et al., "Integrated Circuit Device", U.S. Appl. No. 10/188,824, filed Jul. 5, 2002.
U.S. Appl. No. 10/628,513, filed Jul. 29, 2003, to Tezuka et al.

* cited by examiner

Primary Examiner—David Nelms
Assistant Examiner—Long Tran
(74) Attorney, Agent, or Firm—Finnegan, Henderson, Farabow, Garrett & Dunner, L.L.P.

(57) ABSTRACT

A field effect transistor comprises a source and a drain, and a channel layer of $Si_{1-x-y}Ge_xC_y$ crystal ($1>x>0$, $1>y\geq0$). Ge composition increases toward a drain end, in a vicinity of a source end of the channel layer.

9 Claims, 8 Drawing Sheets

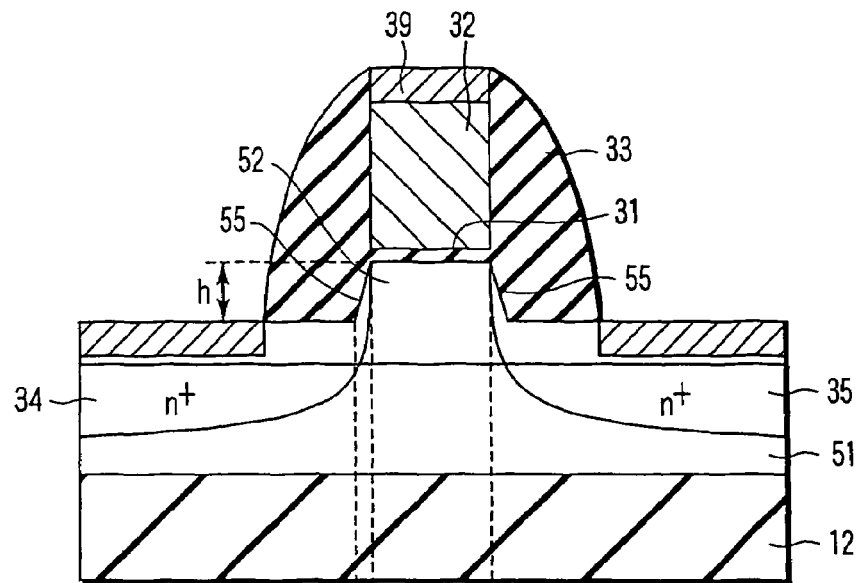
F I G. 4A
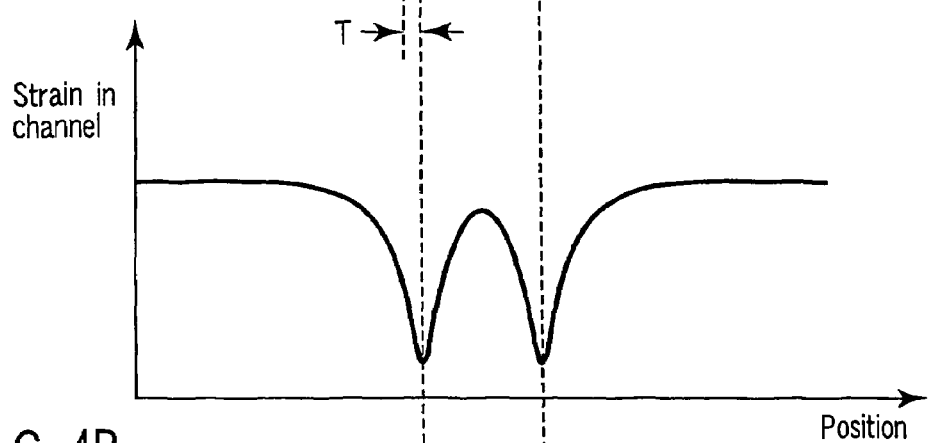
F I G. 4B
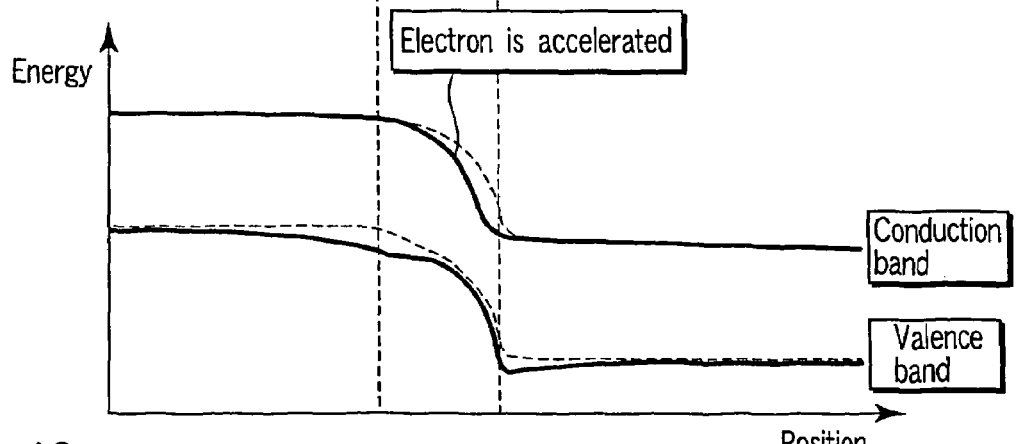
F I G. 4C

FIELD EFFECT TRANSISTOR

CROSS-REFERENCE TO RELATED APPLICATIONS

This application is based upon and claims the benefit of priority from the prior Japanese Patent Application No. 2002-192681, filed Jul. 1, 2002, the entire contents of which are incorporated herein by reference.

BACKGROUND OF THE INVENTION

1. Field of the Invention

This invention relates to a field effect transistor serving as a main component of an integrated circuit element and, more particularly, a field effect transistor having a strain distribution channel.

2. Description of the Related Art

Recently, technical and economic barriers to reduction of a gate length in a field effect transistor (MOSFET) have been radically higher. To relax this condition, a technique of using a channel material with high mobility and, particularly, strained-Si and strained-SiGe, has been noticed.

Strained SiGe is a SiGe crystalline thin film which is in a state of lattice matching on a Si substrate, and has compressive strain in an in-plane direction of the substrate. Due to influences of the compressive strain, a band structure is varied and, particularly, hole mobility increases as compared with Si. In this case, as Ge composition is higher, the strain increases and the hole mobility becomes higher. On the other hand, strained Si is formed on lattice-relaxed SiGe having a greater lattice constant, and has a tensile strain in the in-plane direction of the substrate. Due to influences of the tensile strain, the band structure is varied and, both the electron mobility and the hole mobility increase as compared with Si. In this case, as the Ge composition of the base SiGe is greater, an amount of the stain in the strained-Si becomes greater and the mobilities become higher.

If a CMOS is composed of MOSFETs having the strain-SiGe or strained-Si channels, more high-speed operations can be expected than a Si-CMOS of the same size.

The present inventors have proposed a MOSFET (a strained-SOI-MOSFET) obtained by combining strained SiGe or strained Si with the SOI (Si-On-Insulator) structure and demonstrated its operations (T. Tezuka, N. Sugiyama, T. Mizuno and S. Takagi, IEDM Tech. Dig. 946 (2001)., T. Mizuno, S. Takagi, N. Sugiyama, J. Koga, T. Tezuka, K. Usuda, T. Hatakeyama, A. Kurobe, and A. Toriumi, IEDM Technical Digests p.934 (1999)).

BRIEF SUMMARY OF THE INVENTION

An object of the present invention is to provide a field effect transistor capable of enhancing the carrier velocity at the source end and the operating speed.

A field effect transistor according to a first aspect of the present invention comprises a source, a drain, and a channel layer of $Si_{1-x-y}Ge_xC_y$ crystal ($1>x>0$, $1>y\geq 0$), and is characterized in that the Ge composition increases toward the drain end, in the vicinity of the source end of the channel layer.

A field effect transistor according to a second aspect of the present invention comprises a source, a drain, and a channel layer of $Si_{1-x-y}Ge_xC_y$ crystalline layer ($1>x\geq 0$, $1>y\geq 0$) having a lattice strain, and is characterized in that the strain increases toward the drain end, in the vicinity of the source end of the channel layer.

The present invention can also be achieved as an invention of a method of producing the field effect transistor according to each of the above-described aspects.

BRIEF DESCRIPTION OF THE SEVERAL VIEWS OF THE DRAWING

FIGS. 4A to 4C show a device structure, a Ge composition and energy distribution, of a MOSFET according to a third embodiment of the present invention, respectively;

DETAILED DESCRIPTION OF THE INVENTION

Embodiments of the present invention will be described below with reference to the drawings.

(First Embodiment)

Figure 1A:
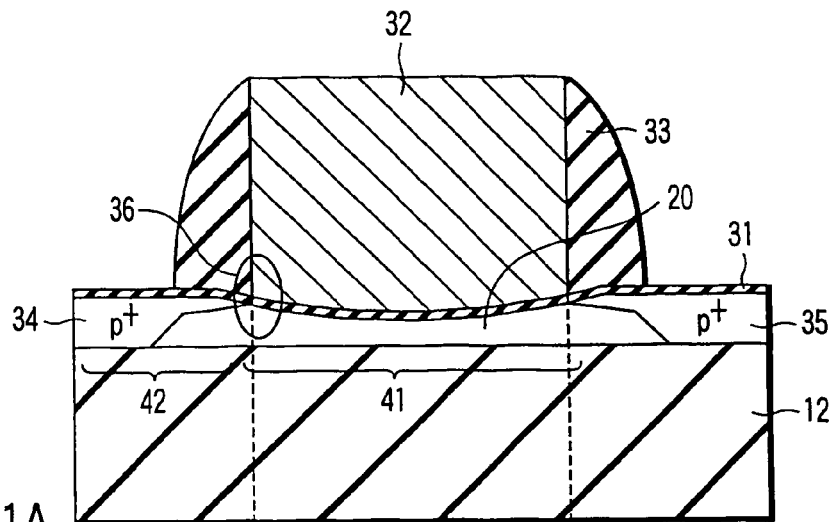
FIGS. 1A to 1C show a device structure, a Ge composition and energy distribution, of a MOSFET according to a first embodiment of the present invention.
Figure 1B:
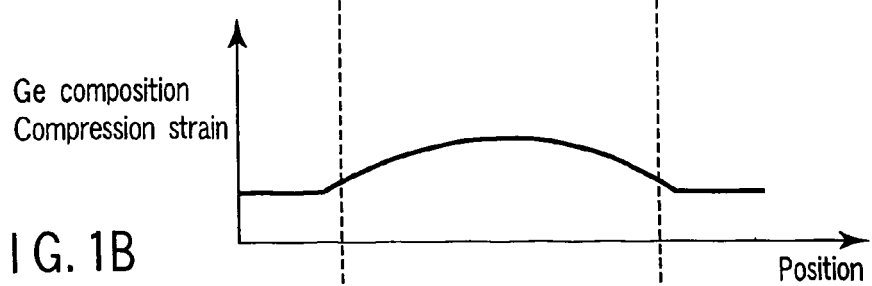
Figure 1C:
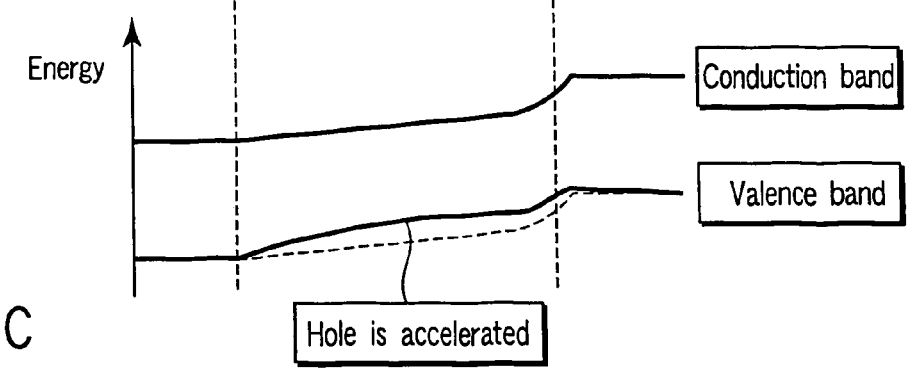

FIGS. 1A to 1C show a device structure, a Ge composition and energy distribution, of a MOSFET according to a first embodiment of the present invention.

The first embodiment is a pMOSFET which has a strained-$Si_{1-x}Ge_x$ layer 20 as a channel formed on a $SiO_2$ film 12 as shown in FIG. 1A. A poly-SiGe gate 32 is formed on the channel layer 20 through a gate oxide film 31. Sidewall insulation films 33 are formed on side portions of the gate 32. A source region 34 and a drain region 35 are formed by doping the SiGe layer 20 with a p-type impurity on both sides of the gate-32.

Ge composition x of the channel layer 20 is maximum (x=0.35) around a center of the gate and minimum (x=0.065) in the source and drain regions 34 and 35 as shown in FIG. 1B. A SiGe film in a high Ge concentration region 41 is thinner than a SiGe film in a low Ge concentration region 42. In accordance with the Ge concentration, compressive strain parallel to a substrate surface in the SiGe layer is also maximum around the center of the gate and minimum in the source 7 and drain regions 34 and 35.

Thus, the compressive strain increases toward the drain direction in a vicinity 36 of the source. As a result, energy at a top of a valence band increases more than energy in a case where the channel layer has uniform and equal composition to the composition in the source, as shown in a band diagram of FIG. 1C. For this reason, holes implanted from the source are rapidly accelerated as compared with the case where the channel layer has uniform composition, by an additional field resulting from strain gradient, and reaches the drain in a shorter time.

Figure 2A:
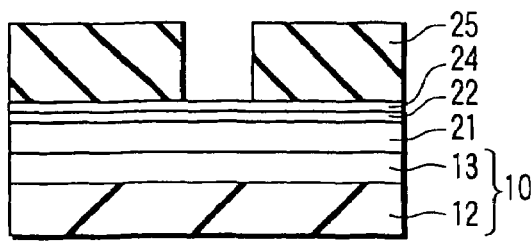
FIGS. 2A to 2G show cross-sectional views of manufacturing steps of the MOSFET of FIG. 1A.

Next, a method of manufacturing the MOSFET according to the first embodiment will be explained with reference to FIGS. 2A to 2G. 1.5 First, epitaxial growth of a $Si_{0.85}Ge_{0.15}$ layer 21 which is 23 nm thick and a Si cap layer 22 which is 10 nm thick are grown by UHV-CVD (Ultra-High Vacuum Chemical Vapor Deposition), LP-CVD (Low-Pressure Chemical Vapor Deposition) or the like, on a SOI substrate 10 formed by forming a Si layer 13 which is 20 nm thick on an insulating film 12 of $SiO_2$ or the like, as shown in FIG. 2A. Then, an oxide film 24 which is 10 nm thick is formed on the cap layer 22 by thermal oxidation, a $Si_3N_4$ film (oxidation-resistant mask layer) 25 which is 100 nm thick is deposited by CVD, a groove which is 100 nm wide is formed by photolithography and RIE to expose the Si cap layer 22.

Figure 2B:
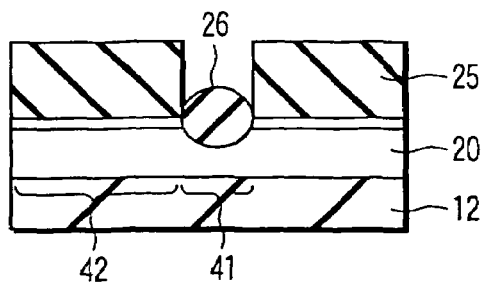

Next, when oxidation is performed in an oxygen atmosphere at 1050° C., the SiGe layer 21 and the Si cap layer 22 are oxidized in an only region immediately under the groove of the $Si_3N_4$ film 25 and a $SiO_2$ film 26 is thereby formed, as shown in FIG. 2B. At this time, Ge atoms are pushed out from the oxide film 26. For this reason, the Ge composition of a part 41 immediately under the groove rises as the oxidation proceeds. This is a technique called an oxidation-condensation method (see Jpn. Pat. Appln. KOKAI Publication No. 2002-76347). In the thermal treatment, interfaces of the Si layers 13 and 22, and the SiGe layer 21 disappear due to interdiffusion of Ge and Si and these layers become a single layer as the SiGe layer 20.

On the other hand, the Ge composition is reduced due to interdiffusion of Ge atoms and Si atoms in a region 42 protected by the mask. In the SiGe layer, the only Ge composition is varied without lattice relaxation. Therefore, the compressive strain becomes greater in a region of higher Ge composition. Oxidation is performed until the thickness of a thickest portion of the high Ge composition region 41 becomes 10 nm.

Figure 2C:
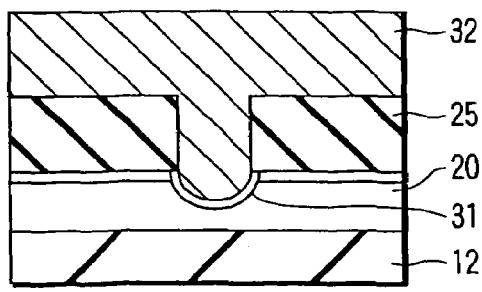
Figure 2D:
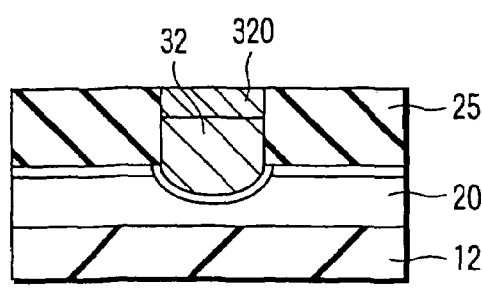

Next, after the oxide film 26 is removed, a Si cap layer which is 2 nm thick is formed by epitaxial growth (not shown) and a surface of the Si cap layer is oxidized as shown in FIG. 2C. A gate oxide film 31 which is 1.5 nm thick is thereby formed. Furthermore, a poly-SiGe film 32 which is to serve as a gate electrode is buried in the groove. Next, a surface of the poly-SiGe film 32 is removed and flattened by a CMP (Chemical Mechanical Polishing) process as shown in FIG. 2D. After that, the surface of the poly-SiGe film 32 is oxidized to form an oxide film 320.

Figure 2E:
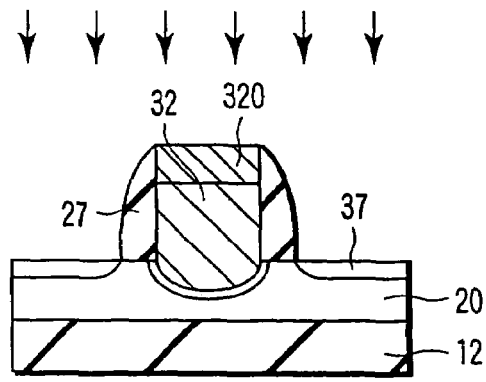
Figure 2F:
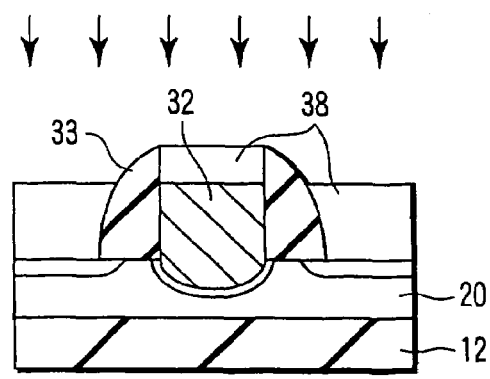

Next, gate sidewall insulation films 27 are formed by RIE (reactive ion etching) after removal of the $Si_3N_4$ film 25 and re-deposition of a $Si_3N_4$ film (not shown). Then, $BF_2$ ions are implanted to form an extension region 37 of the source and the drain as shown in FIG. 2E. Next, after a sidewall insulation film 33 is formed on an outer side of the sidewall insulation film 27, the oxide film 320 is removed. The Si layer 38 is subjected to selective growth by the UHV-CVD or LP-CVD as shown in FIG. 2F. Furthermore, $BF_2$ ions are implanted, and pulse annealing is performed for a second at 1050° C. to make impurity of the source and drain regions 34 and 35 and the gate 32 activated.

Figure 2G:
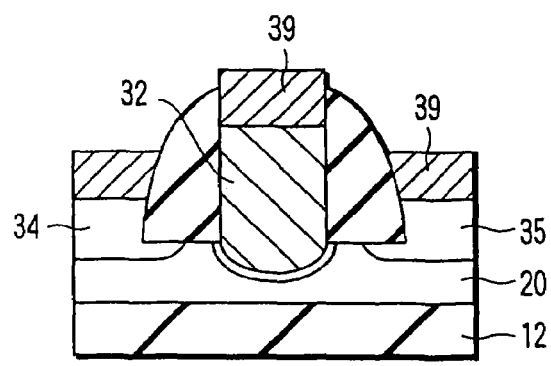

Next, top surfaces of the source, the drain and the gate are changed into metal silicide layers 39 as shown in FIG. 2G. After that, the MOSFET is completed by performing conventional wiring steps.

According to the first embodiment, as described above, the oxidation-resistant mask layer 25 partly having an opening is formed on the SiGe layer 20 on the insulation film 12, thermal oxidation is performed, and thereby the Ge composition in the SiGe layer 20 immediately under the opening of the mask layer 25 is enhanced. The band structure in which the energy at the top of the valence band at the source end increases toward the drain as shown in FIG. 1C can be implemented by forming the field effect transistor in which the SiGe layer 20 having the Ge composition partially enhanced serves as the channel layer. For this reason, carriers at the source end can be rapidly accelerated and high-speed operations can be performed.

(Second Embodiment)

Figure 3A:
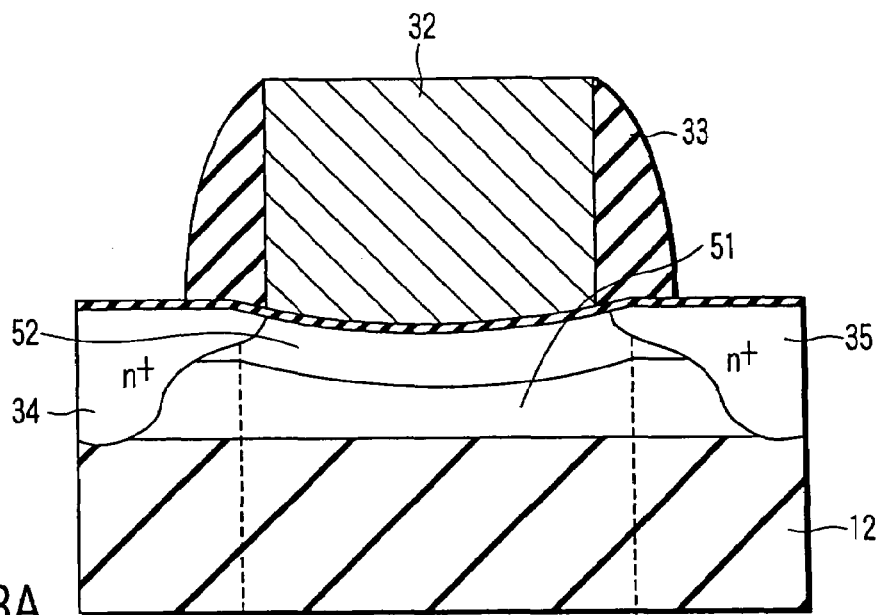
FIGS. 3A to 3C show a device structure, a Ge composition and energy distribution, of a MOSFET according to a second embodiment of the present invention, respectively.
Figure 3B:
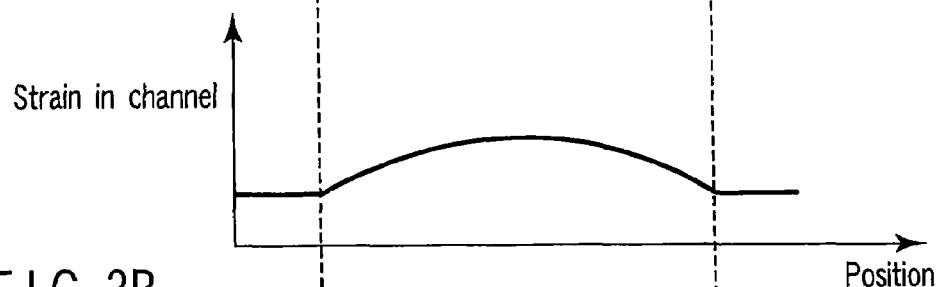
Figure 3C:
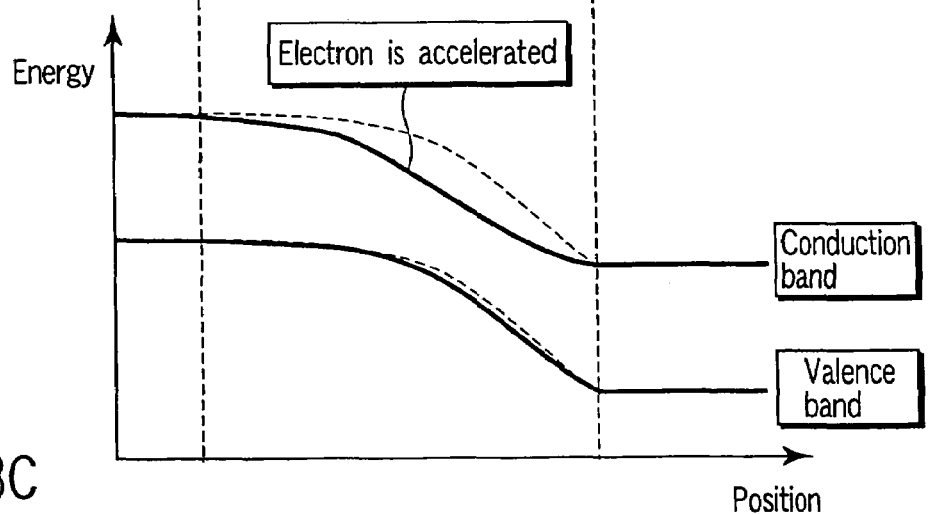

FIGS. 3A to 3C show a device structure, a Ge composition and energy distribution, of a MOSFET according to a third embodiment of the present invention, respectively. In FIGS. 3A to 3C, the same portions as those shown in FIGS. 1A to 1C are denoted by the same reference numerals, and their detailed descriptions will be omitted.

In the second embodiment, a strained-Si layer 52 is formed on a lattice-relaxed $Si_{1-x}Ge_x$ layer 51 formed similarly to the first embodiment and an nMOSFET is further formed on the Si layer 52 as shown in FIG. 3A. Ge composition x of the thinnest portion of the $Si_{1-x}Ge_x$ layer 51 is 0.55, which shows approximately 60% of lattice relaxation. For this reason, the Si layer 52 immediately above the thinnest portion has tensile strain. On the other hand, the Ge composition in the source and drain regions is 0.09, which shows no lattice relaxation. Therefore, the Si layer 52 has the strain distribution as shown in FIG. 3B.

The SiGe layer in the second embodiment is formed by epitaxial growth of a 10-nm Si cap layer, a 30-nm thick $Si_{0.82}Ge_{0.18}$ layer on a 20-nm thick SOI layer, forming a mask similarly to the first embodiment, oxidizing the laminated structure until the thinnest portion of the SiGe layer 51 is 10 nm thick and forming the 10-nm thick strained Si layer by the UHV-CVD, LP-CVD or the like on the lattice-relaxed SiGe layer 51.

In the second embodiment, electrons are accelerated rapidly to reach the drain in a shorter time, as compared with a case of using a SiGe layer having uniform composition as a base, by an additional field resulting from strain gradient in the channel direction of the strained-Si layer 52. Therefore, high-speed operations can be performed similarly to the first embodiment.

(Third Embodiment)

FIGS. 4A to 4C show a device structure, a Ge composition and energy distribution, of a MOSFET according to a third embodiment of the present invention, respectively. In FIGS. 4A to 4C, the same portions as those shown in FIGS. 1A to 1C are denoted by the same reference numerals, and their detailed descriptions will be omitted.

The MOSFET according to the third embodiment is an nMOSFET which comprises the strained-Si layer 52 as a channel formed on the lattice-relaxed $Si_{0.7}Ge_{0.3}$ layer 51 on the buried oxide film 12 and which has a gate length of 35 nm, as shown in FIG. 4A. A step 55 which is 10 nm high exists at each of the source and drain ends as shown in FIG. 4A. Thus, the strain is locally relaxed as shown in FIG. 4B. As a result, as shown in FIG. 4C, the energy at a bottom of a conduction band in the channel region is reduced similarly to the second embodiment. That is, electrons are rapidly accelerated to reach the drain in a shorter time, as compared with a case where no steps are formed, by an additional field resulting from strain gradient in the channel direction of the strained-Si layer 52. Therefore, high-speed operations can be performed.

It is desirable that the Ge composition of the base SiGe layer 51 ranges approximately from 0.1 to 0.5. Further preferably, it is desirable that the composition ranges from 0.15 to 0.4. These values are obtained by considering that the mobility of the strained-Si layer 52 simply increases to the Ge composition of the relaxed SiGe layer 51 serving as the base, but tends to be saturated when the composition is approximately 0.15, and that difficulty in the manufacturing process increases if the Ge composition is higher than 0.4. It is also desirable that height h of the step 55 is equal to or more than 7 nm and is, preferably, approximately 12 nm.

Figure 5:
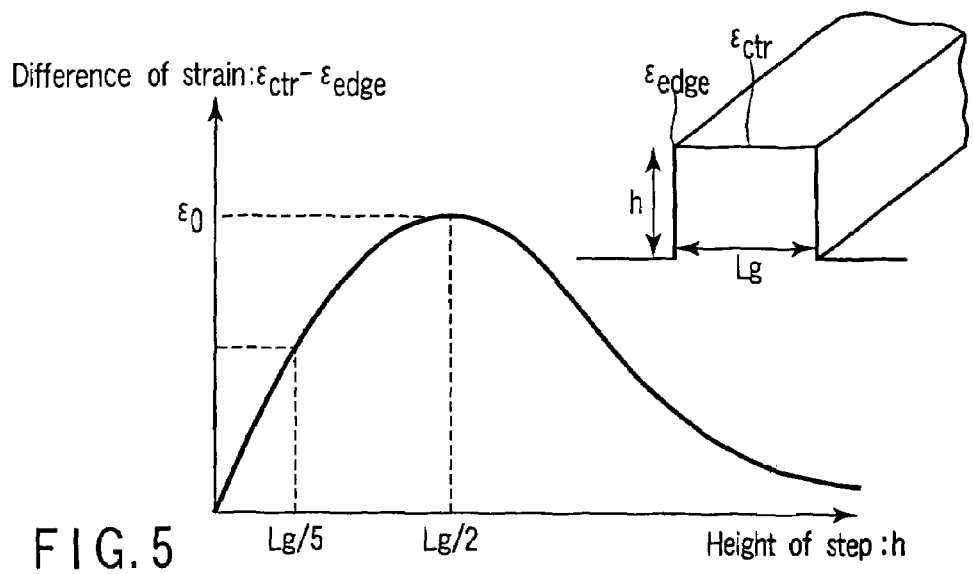
FIG. 5 shows a graph of a relationship between a height of a step and a strain difference for explanation of the third embodiment.

The basis of these numerical values is explained below. FIG. 5 shows a result of calculation about a strain difference between a mesa end portion and a central portion in a case of processing a sufficiently thick strained Si as a mesa having a width Lg and a height h. The strain difference reaches its peak value when h=Lg/2, as shown in FIG. 5. It is also understood that when L=Lg/5, approximately half the peak value of the strain difference can be obtained.

In the third embodiment, the above values can be obtained when Lg=35 nm. In an actual device, the step portion is not vertically cut away, and often has a transition region having a width T as shown in FIG. 4A. In this case, an optimum value may be obtained with Lg+T instead of Lg, as a rough estimation. For example, if T=10 nm, it is desirable that the height h of the step is 9 nm or more and, preferably, approximately 23 nm.

Figure 6A:
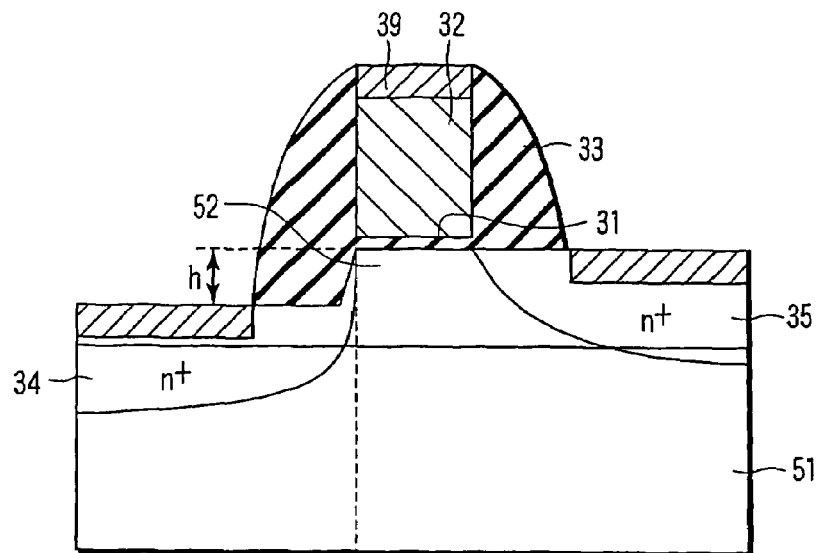
FIGS. 6A to 6C show a device structure, a Ge composition and energy distribution, of a MOSFET according to a modified example of the third embodiment of the present invention.
Figure 6B:
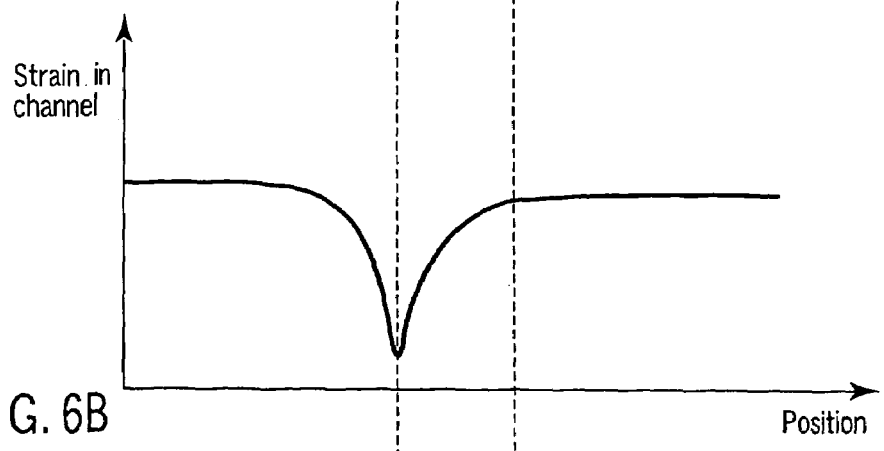
Figure 6C:
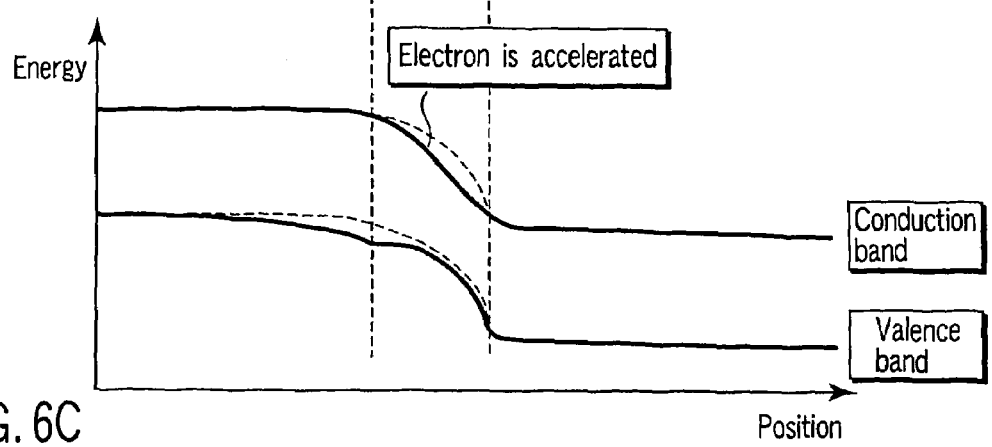

As a modified example, the third embodiment can be configured to have a structure in which the step is formed at the only source end. It can also be configured to have a structure in which the buried oxide film does not exist, i.e. strained Si is formed on the relaxed SiGe buffer layer on the Si substrate. Furthermore, It can be configured to have a structure in which the step is formed at the only source end and strained Si is formed on the relaxed SiGe buffer layer on the Si substrate, as shown in FIGS. 6A to 6C.

(Fourth Embodiment)

Figure 7:
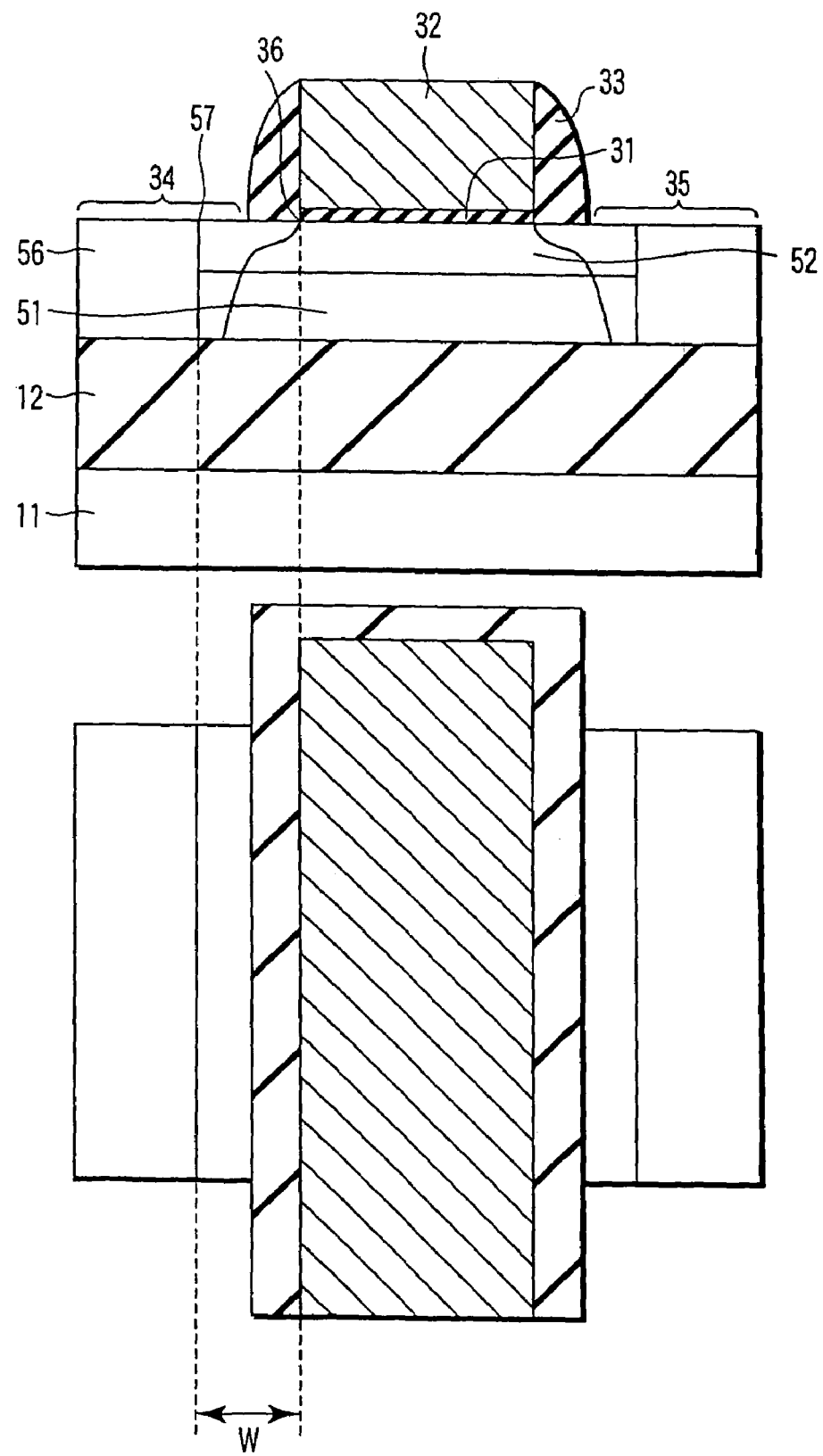
FIG. 7 shows a cross-sectional view and a plan view of a device structure of a MOSFET according to a fourth embodiment of the present invention.

FIG. 7 shows a cross-sectional view and a plan view of a device structure of a MOSFET according to a fourth embodiment of the present invention. In FIG. 7, the same portions as those shown in FIGS. 1A to 1C are denoted by the same reference numerals, and their detailed descriptions will be omitted.

The MOSFET-according to the fourth embodiment is an nMOSFET which comprises the strained-Si layer 52 as a channel on the relaxed SiGe layer 51 formed on the buried oxide film 12, and is characterized in that parts 56 of the source and drain are made polycrystalline. As a crystalline grain boundary which becomes a slip plane exists at a high density in the polycrystal, the lattice can easily be deformed by a slippage on a polycrystalline/crystalline boundary 57 in the source. As a result, the strain in the vicinity of the boundary 57 is locally relaxed, and electrons are rapidly accelerated to reach the drain in a shorter time, as compared with a case of not forming the polycrystalline region, on the same principle as that of the third embodiment.

A width W between the boundary 57 and the source end 36 is 50 nm. It is desirable that the interval W is small within a range in which the grain boundary does not enter a depletion layer in the vicinity of the source/drain end. However, if it is approximately 1 $\mu$m or smaller, the above-mentioned advantage can be obtained. The polycrystalline region is formed by making the crystalline layer on the insulation film amorphous by ion implantation until it reaches the insulation film boundary, and by subjecting the layer to thermal treatment. Therefore, it is also possible to form the polycrystalline region and the source simultaneously. As a modified example, the fourth embodiment can be configured to have a structure in which the polycrystalline region is formed at the only source end. It can also be configured to have a structure in which it is formed not on the buried oxide film, but on the SiGe buffer layer on the Si substrate.

(Fifth Embodiment)

Figure 8:
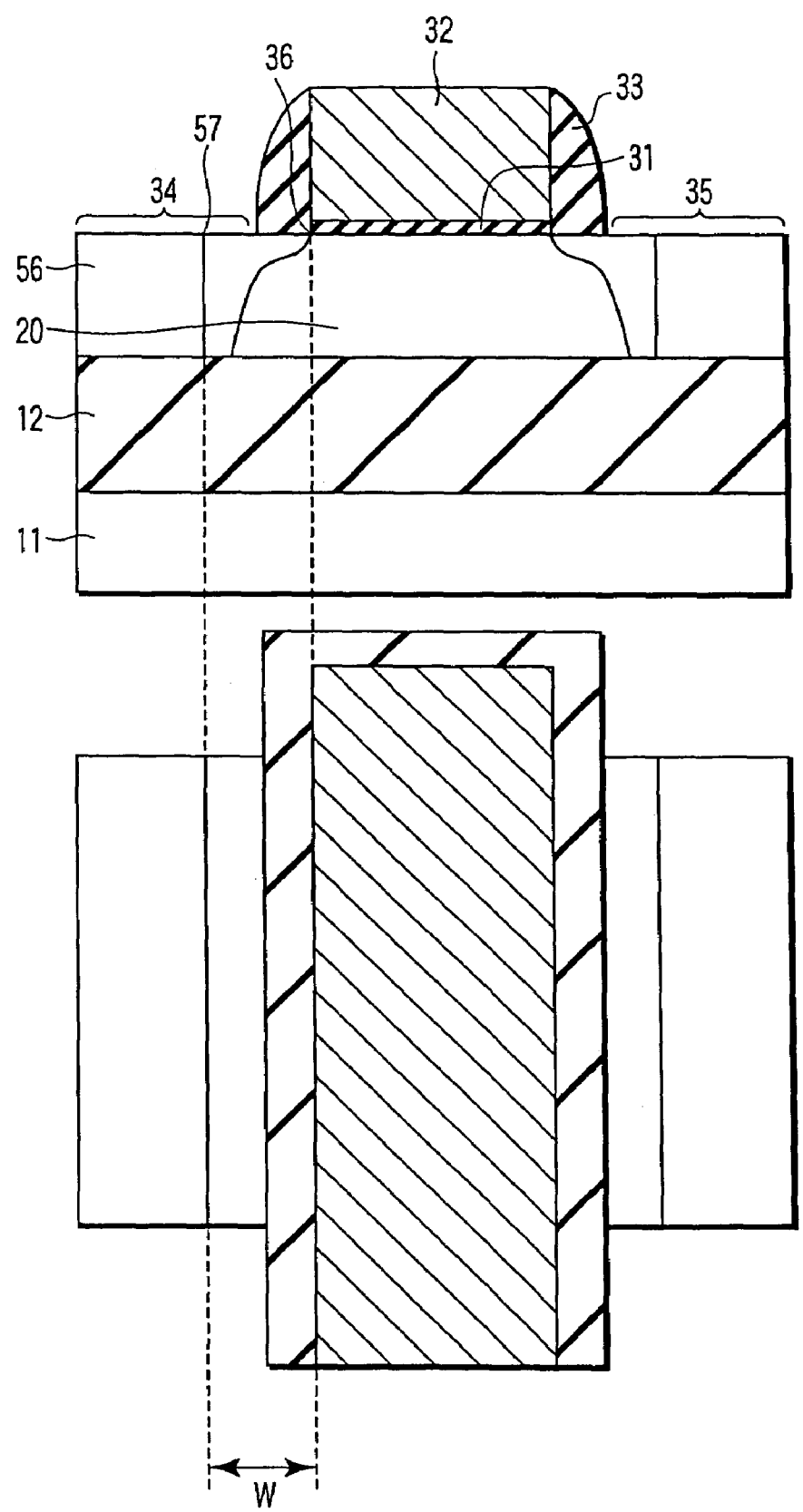
FIG. 8 shows a cross-sectional view and a plan view of a device structure of a MOSFET according to a fifth embodiment of the present invention.

FIG. 8 shows a cross-sectional view and a plan view of a device structure of a MOSFET according to a fifth embodiment of the present invention. In FIG. 8, the same portions as those shown in FIGS. 1A to 1C are denoted by the same reference numerals, and their detailed descriptions will be omitted.

The MOSFET according to the fifth embodiment is a pMOSFET which comprises the strained-SiGe layer 20 as a channel formed on the buried oxide film 12, and is characterized in that parts 56 of the source and drain are polycrystallized. As a crystalline grain boundary serving as a slip plane exists at high density in the polycrystal, the lattice can easily be deformed by a slippage on the polycrystalline/crystalline boundary 57 in the source. As a result, the strain in the vicinity of the boundary 57 is locally relaxed, and the holes are rapidly accelerated to reach the drain in a shorter time, as compared with a case of not forming the polycrystalline region, on the same principle as that of the first embodiment.

A width W between the boundary 57 and the source end 36 is 50 nm. It is desirable that the interval W is small within a range in which the grain boundary does not enter a depletion layer in the vicinity of the source/drain end. However, if it is approximately 1 $\mu$m or smaller, the above-mentioned advantage can be obtained. The polycrystalline region is formed by making the crystalline layer on the insulation film amorphous by ion implantation until it reaches the insulation film boundary, and by subjecting the layer to thermal treatment. Therefore, it is also possible to form the polycrystalline region and the source simultaneously.

As a modified example, the fifth embodiment can be configured to have a structure in which the polycrystalline region is formed at the only source end. It can also be configured to have a structure in which it is formed not on the buried oxide film, but on the Si substrate.

(Sixth Embodiment)

Figure 9:
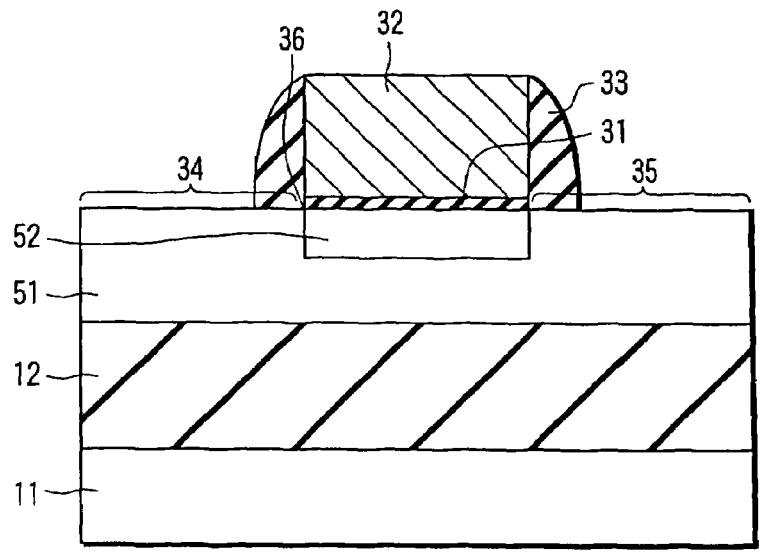
FIG. 9 shows a cross-sectional view of a device structure of a MOSFET according to a sixth embodiment of the present invention.

FIG. 9 shows a cross-sectional view of a device structure of a MOSFET according to a sixth embodiment of the present invention. In FIG. 9, the same portions as those shown in FIGS. 1A to 1C are denoted by the same reference numerals, and their detailed descriptions will be omitted.

The MOSFET according to the sixth embodiment is an nMOSFET which comprises the strained-Si layer 52 as a channel on the relaxed SiGe layer 51 formed on the buried oxide film 12, and is characterized in that the source and drain are lattice-relaxed SiGe. As the strain is locally relaxed at the source end 36, the electrons are rapidly accelerated to reach the drain in a shorter time, as compared with the prior art that the source and drain regions are strained-Si, similarly to the channel, on the same principle as that of the third embodiment. Furthermore, the embodiment has a merit that as a discontinuous boundary of the conduction band is situated at the source end, an injection speed of electrons becomes higher.

As a modified example, the sixth embodiment can be configured to have a structure in which the source is lattice-relaxed SiGe and the drain is strained Si.

(Seventh Embodiment)

Figure 10:
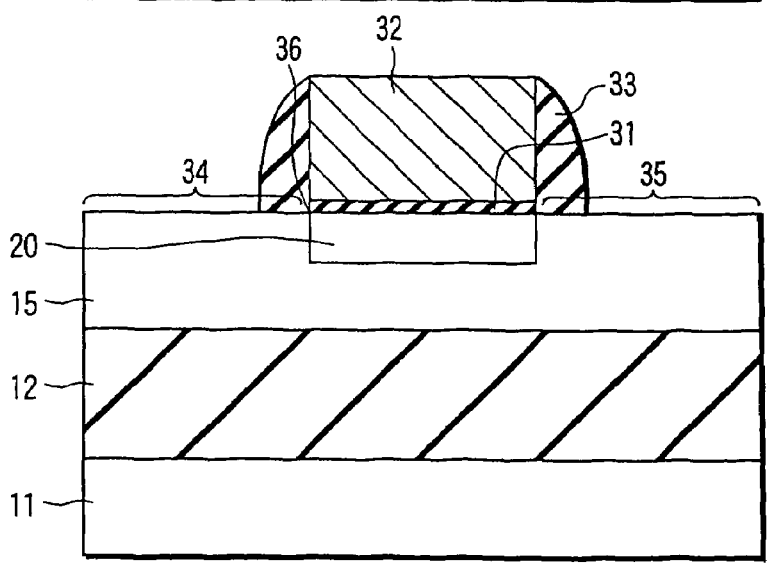
FIG. 10 shows a cross-sectional view of a device structure of a MOSFET according to a seventh embodiment of the present invention.

FIG. 10 shows a cross-sectional view of a device structure of a MOSFET according to a seventh embodiment of the present invention. In FIG. 10, the same portions as those shown in FIGS. 1A to 1C are denoted by the same reference numerals, and their detailed descriptions will be omitted.

The MOSFET according to the seventh embodiment is a pMOSFET which comprises the strained-SiGe layer 20 as a channel on the Si layer 15 formed on the buried oxide film 12, and is characterized in that the source and drain are lattice-relaxed Si. As the strain of the strained-SiGe channel is locally relaxed at the source end 36, the holes are rapidly accelerated to reach the drain in a shorter time, as compared with the prior art that the source and drain regions are strained SiGe similarly to the channel, on the same principle as that of the first embodiment. Furthermore, the embodiment has a merit that as the discontinuous boundary of the valence band is situated at the source end, an injection speed of the holes becomes further higher.

As a modified example, the seventh embodiment can be configured to have a structure in which the source is lattice-relaxed SiGe and the drain is strained SiGe.

(Modification)

The present invention is not limited to the above-described embodiments, and can be variously modified in a range which does not exceed its gist.

In all of the embodiments, the materials of the gate electrodes, the gate insulation films, sidewall and the like can be arbitrarily changed. For example, it is possible to use, as the gate electrode, a polycrystalline semiconductor such as poly-silicon, poly-silicon germanium or the like, a metal such as titanium, tungsten, titanium nitride, cobalt silicide, cobalt germanide, nickel silicide, nickel germanide, titanium silicide, titanium germanide, tungsten silicide, tungsten germanide or the like, or an alloy consisting of two or more of them. It is possible to use, as the gate insulation film, a SiON film, a $Si_3N_4$ film, a Zr or Hf silicate film, a Zr or Hf silicate film containing Al, a Zr or Hf oxide film, a Zr or Hf oxide film containing Al, a Zr or Hf acid nitride film, a Zr or Hf acid nitride film containing Al, or the like. In addition, a structure in which the channel or the buffer layer contains approximately 0.1% to a few % of carbon can also be employed. In this case, as the amount of strain of SiGeC also depends on the content of carbon, the degree of freedom in strain control increases. The effect of restricting the diffusion of impurities also can be expected. Moreover, a structure in which the channel or the buffer layer contains approximately 0.1% to a few % of tin can be employed. In this case, as the amount of strain also depends on the content of tin, the degree of freedom in strain control increases.

The following inventions can be extracted from the above-described embodiments. Each of the inventions can be applied independently or the inventions can arbitrarily combined.

A field effect transistor according to a first aspect of the present invention comprises a source, a drain, and a channel layer of $Si_{1-x-y}Ge_xC_y$ crystal ($1>x>0$, $1>y\geq0$), and is characterized in that the Ge composition increases toward the drain end, in the vicinity of the source end of the channel layer.

A field effect transistor according to a second aspect of the present invention comprises a source, a drain, and a channel layer of $Si_{1-x-y}Ge_xC_y$ crystalline layer ($1>x\geq0$, $1>y\geq0$) having a lattice strain, and is characterized in that the strain increases toward the drain end, in the vicinity of the source end of the channel layer.

In the first and second aspects, the following embodiments are preferable:

(1) The channel layer is formed on an insulation film.

(2) The transistor further comprises a buffer layer of $Si_{1-u-v}Ge_uC_v$ crystal ($1>u>0$, $1>v\geq0$) formed between the insulation film and the channel layer.

(3) The source and drain regions are in an n-type, and energy at a bottom of a conduction band reduces toward the drain end, in the vicinity of the source end of the channel layer.

(4) The source and drain regions are in a p-type, and energy at a top of a valence band increases toward the drain end, in the vicinity of the source end of the channel layer.

In the second aspect, the following embodiments are preferable:

(1) The lattice strain is partially relaxed in the vicinity thereof and thereby increases toward the drain end by a step or a slit provided in the vicinity of the source end of the channel layer.

(2) The lattice strain increases toward the drain end by providing a $Si_{1-u-v}Ge_uC_v$ polycrystalline layer ($1>u\geq0$, $1>v\geq0$) as a part of the source region adjacent to the channel layer.

A method of producing a field effect transistor according to a third aspect of the present invention is a method of producing a field effect transistor comprising a SiGeC crystalline layer as a channel layer. The method is characterized by comprising a step of forming an oxidation-resistant mask layer having an opening on a part of a $Si_{1-x-y}Ge_xC_y$ crystalline layer ($1>x>0$, $1>y\geq0$) on an insulation film and a step of performing thermal oxidation to enhance Ge composition of the $Si_{1-x-y}Ge_xC_y$ crystalline layer immediately under the opening of the mask layer.

A method of producing a field effect transistor according to a fourth aspect of the present invention is also a method of producing a field effect transistor comprising a SiGeC crystalline layer as a channel layer. The method is characterized by comprising a step of forming an oxidation-resistant mask layer having an opening on a part of a $Si_{1-x-y}Ge_xC_y$ crystalline layer ($1>x>0$, $1>v\geq0$) on an insulation film, a step of performing thermal oxidation to enhance Ge composition of the $Si_{1-x-y}Ge_xC_y$ crystalline layer immediately under the opening of the mask layer, and a step of forming a $Si_{1-x-y}Ge_xC_y$ crystalline layer ($1\geq x\geq0$, $1>y\geq0$) having lattice strain on the $Si_{1-u-v}Ge_uC_v$ crystalline layer.

According to one aspect of the present invention, the energy at the bottom of the conduction band at the source end can be reduced (in the case of the n-type) or the energy at the top of the valence band can be increased (in the case of the p-type) toward the drain end, by optimizing the Ge composition and the strain in the channel layer. For this reason, the carriers are rapidly accelerated, the running time from the source to the drain end becomes short, and high-speed operations can be thereby performed, as compared with the prior art of uniform strain. This advantage becomes more remarkable as the channel length is smaller. Therefore, in a short-channel MOSFET, the operations can be performed at a much higher speed than a conventional MOSFET using a uniform strain channel.

As for the Ge composition, the Ge composition needs to increase toward the drain end, in the vicinity of the source end of the channel layer. As for the strain, a strained-SiGe or strained-Si channel layer having a profile which allows the compressive and tensile in-plane strain to be increased, respectively, in the proceeding direction of the carriers, may be provided in the vicinity of the source end.

For their implementation, a mask layer is formed on an upper part of a SiGe layer on an insulation film, an opening is formed on a part of the mask layer, and thermal oxidation is performed to form a region in which the Ge composition is higher than that in the source and drain regions, in a region immediately under the opening. Furthermore, a mask layer is formed on an upper part of a strained- or relaxed-SiGe layer on an insulation film, a opening is formed on a part of the mask layer, and thermal oxidation is performed to form a region in which the Ge composition is higher than that in the source and drain regions, in a region immediately under the opening. After that, a strained-Si channel is formed. In addition, a step or a slit is formed in the vicinity of the source end. Moreover, a part of the source is changed to polycrystalline in a strained-Si or strained-SiGe MOSFET formed on the insulation film.

As described above, according to one aspect of the present invention, the energy at the bottom of the conduction band at the source end can be reduced or the energy at the top of the valence band can be increased, by optimizing the Ge composition and the strain in the channel layer. For this reason, the carriers-can-be rapidly accelerated and, particularly, high-speed operations in a short-channel MOSFET can be effectively performed as compared with the prior art of the uniform strain.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A field effect transistor comprising:
a source and a drain; and
a channel layer of $Si_{1-x-y}Ge_xC_y$ crystal ($1>x>0$, $1>y\geq 0$),
wherein Ge composition increases toward a drain end, in a vicinity of a source end of the channel layer, and
thicknesses of the source and drain are greater than the thickness of a center portion of the channel layer.

2. The field effect transistor according to claim 1, wherein the channel layer is formed on an insulation film.

3. The field effect transistor according to claim 2, further comprising a buffer layer of $Si_{1-u-v}Ge_uC_v$ crystal ($1>u>0$, $1>v\geq 0$) formed between an insulation film and the channel layer.

4. The field effect transistor according to claim 1, wherein the source and drain regions are n-type, and energy at a bottom of a conduction band reduces toward the drain end, in the vicinity of the source end of the channel layer.

5. The field effect transistor according to claim 1, wherein the source and drain regions are p-type, and energy at a top of a valence band increases toward the drain end, in the vicinity of the source end of the channel layer.

6. A field effect transistor comprising:
a source and a drain; and
a channel layer of $Si_{1-x-y}Ge_xC_y$ crystalline layer ($1>x\geq 0$, $1>y\geq 0$) having a lattice strain,
wherein the lattice strain increases toward a drain end, in a vicinity of a source end of the channel layer, and
a step is formed at a source end.

7. The field effect transistor according to claim 6, wherein the channel layer is formed on an insulation film.

8. The field effect transistor according to claim 7, further comprising a buffer layer of $Si_{1-u-v}Ge_uC_v$ crystal ($1>u>0$, $1>v\geq 0$) formed between the insulation film and the channel layer.

9. The field effect transistor according to claim 6, wherein the step height is greater than 7 nm.

* * * * *